United States Patent
Hook et al.

(10) Patent No.: US 9,178,495 B2
(45) Date of Patent: Nov. 3, 2015

(54) ESTABLISHING A THERMAL PROFILE ACROSS A SEMICONDUCTOR CHIP

(71) Applicant: International Business Machines Corporation, Armonk, NY (US)

(72) Inventors: Terence B. Hook, Jericho, VT (US); Christopher M. Schnabel, Wappingers Falls, NY (US); Melanie J. Sherony, Fishkill, NY (US)

(73) Assignee: GLOBALFOUNDRIES U.S. 2 LLC, Hopewell Junction, NY (US)

( * ) Notice: Subject to any disclaimer, the term of this patent is extended or adjusted under 35 U.S.C. 154(b) by 0 days.

(21) Appl. No.: 14/221,859

(22) Filed: Mar. 21, 2014

(65) Prior Publication Data

US 2015/0270828 A1  Sep. 24, 2015

(51) Int. Cl.

| | |
|---|---|
| *H01L 29/12* | (2006.01) |
| *H03K 3/011* | (2006.01) |
| *H01L 23/34* | (2006.01) |
| *H01L 49/02* | (2006.01) |
| *H01L 23/48* | (2006.01) |
| *H01L 21/768* | (2006.01) |
| *H01L 25/065* | (2006.01) |

(52) U.S. Cl.
CPC .......... *H03K 3/011* (2013.01); *H01L 21/76898* (2013.01); *H01L 23/34* (2013.01); *H01L 23/345* (2013.01); *H01L 23/481* (2013.01); *H01L 25/0657* (2013.01); *H01L 28/20* (2013.01); *H01L 2225/06541* (2013.01); *H01L 2225/06589* (2013.01)

(58) Field of Classification Search
CPC .......................... H01L 23/485; H01L 23/522
USPC ......................................................... 257/737
See application file for complete search history.

(56) References Cited

U.S. PATENT DOCUMENTS

| | | | |
|---|---|---|---|
| 6,825,681 | B2 | 11/2004 | Feder et al. |
| 6,956,186 | B1 | 10/2005 | Ito et al. |
| 8,378,453 | B2 | 2/2013 | Fedorov et al. |
| 2005/0149886 | A1 | 7/2005 | Kaushal et al. |
| 2008/0083732 | A1 | 4/2008 | Shinma et al. |
| 2011/0215457 | A1 | 9/2011 | Park |
| 2012/0306082 | A1 | 12/2012 | Sekar et al. |
| 2014/0049293 | A1* | 2/2014 | Mallikarjunaswamy ..... 327/108 |

* cited by examiner

*Primary Examiner* — Tran Tran
(74) *Attorney, Agent, or Firm* — Gibb & Riley, LLC; Anthony Canale

(57) ABSTRACT

Embodiments of the present invention disclose a semiconductor structure and method for establishing a thermal profile across a semiconductor chip. In certain embodiments, the semiconductor structure comprises a through-silicon via formed in a first semiconductor chip having thermal control circuitry, wherein the through-silicon via is formed in a manner to be thermally coupled to the thermal control circuitry and a region of a second semiconductor chip, and wherein the through-silicon via conducts heat from the thermal control circuitry to the region. In other embodiments, the method comprises forming a through-silicon via in a first semiconductor chip having thermal control circuitry. The method also comprises forming the through-silicon via in a manner to be thermally coupled to the thermal control circuitry and a region of a second semiconductor chip, wherein the through-silicon via conducts heat from the thermal control circuitry to the region.

20 Claims, 4 Drawing Sheets

US 9,178,495 B2

ESTABLISHING A THERMAL PROFILE ACROSS A SEMICONDUCTOR CHIP

FIELD OF THE INVENTION

The present invention relates generally to the field of semiconductor structures, and specifically to a semiconductor structure for establishing a thermal profile across a semiconductor chip.

BACKGROUND

During operation, semiconductor chips, such as complementary-metal-oxide-semiconductor chips, can heat up in a non-uniform manner across the semiconductor chip. Such temperatures can influence the performance and reliability of semiconductor chips. Heat generated therein may be dissipated to improve reliability and prevent premature failure. Techniques utilized for dissipating heat generated by semiconductor chips can include the use of heat sinks and fans, as well as additional forms of computer cooling, such as liquid cooling. However, at times, it may be useful to heat electronic components to achieve a desired operation or component characteristic.

SUMMARY

Embodiments of the present invention disclose a semiconductor structure and method for establishing a thermal profile across a semiconductor chip. In certain embodiments, the semiconductor structure comprises a through-silicon via formed in a first semiconductor chip having thermal control circuitry, wherein the through-silicon via is formed in a manner to be thermally coupled to the thermal control circuitry and a region of a second semiconductor chip, and wherein the through-silicon via conducts heat from the thermal control circuitry to the region. In other embodiments, the method comprises forming a through-silicon via in a first semiconductor chip having thermal control circuitry. The method also comprises forming the through-silicon via in a manner to be thermally coupled to the thermal control circuitry and a region of a second semiconductor chip, wherein the through-silicon via conducts heat from the thermal control circuitry to the region.

DETAILED DESCRIPTION

Figure 1:
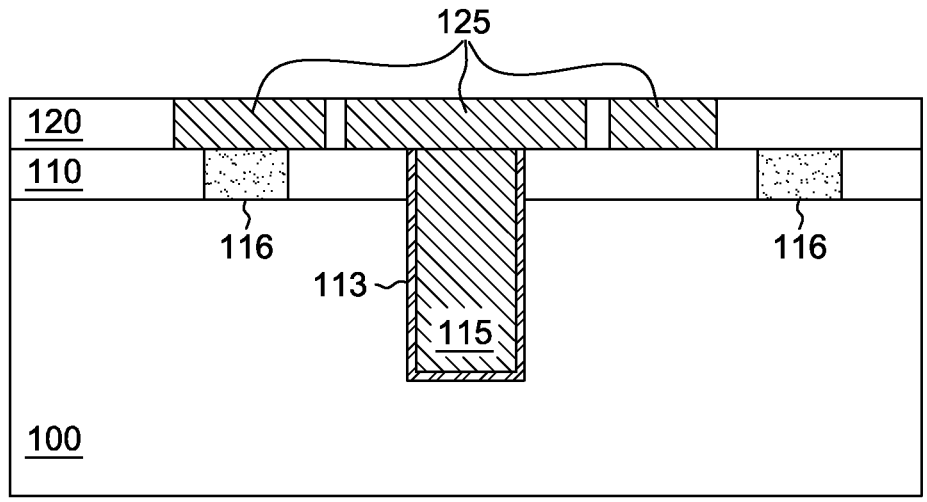
FIG. 1 illustrates a cross-sectional view of principal parts in the fabrication process of a semiconductor structure, in accordance with an embodiment of the present invention.

Detailed embodiments of the claimed structures and methods are disclosed herein. The method steps described below do not form a complete process flow for manufacturing integrated circuits. The present embodiments can be practiced in conjunction with the integrated circuit fabrication techniques currently used in the art, and only so much of the commonly practiced process steps are included as are necessary for an understanding of the described embodiments. The figures represent cross-section portions of a semiconductor chip or a substrate during fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

During operation, semiconductor chips (chips), such as complementary-metal-oxide (CMOS) chips, generate heat and can do so in a non-uniform manner across the surface of the chip. Chip temperature can influence leakage, performance, and reliability. Certain embodiments of the present invention seek to selectively apply heat to regions of semiconductor chips, through one or more through-silicon vias (TSVs), from one chip to another in a controlled manner. A heater chip is joined in a package with a functional product chip, whereby the two chips are connected through 3D chip bonding across the width and breadth of the chip. Regions of the functional product chip are independently or uniformly heated to provide a desired thermal profile. In certain embodiments, control circuitry for the heater chip is formed on the functional product chip. In other embodiments, sensors on the functional product chip control the heating profile generated by the heater chip.

Figure 2:
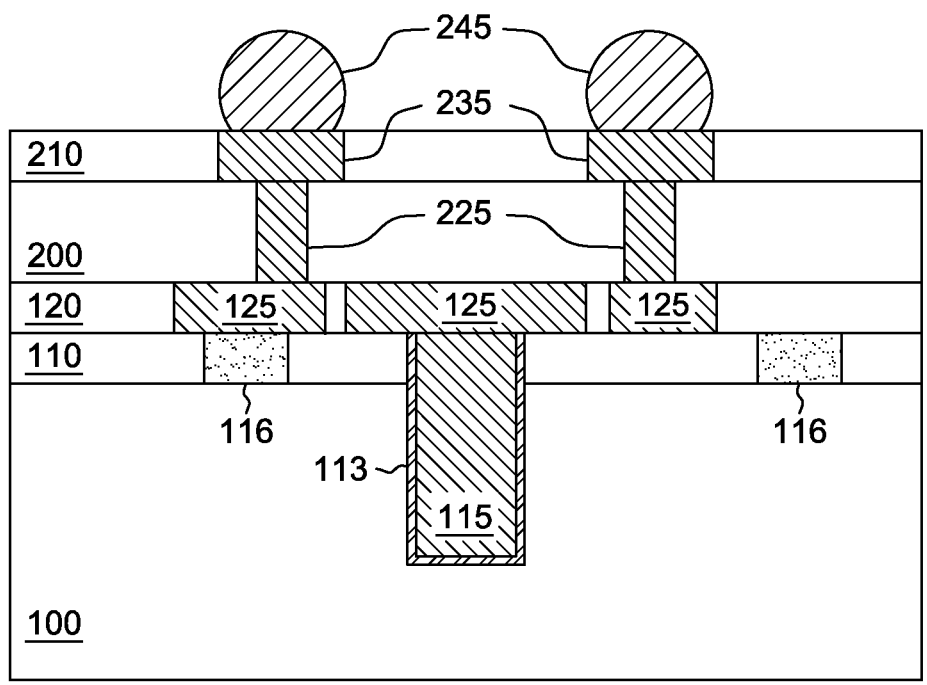
FIG. 2 illustrates a cross-sectional view of principal parts in the fabrication process of the semiconductor structure, in accordance with an embodiment of the present invention.
Figure 3A:
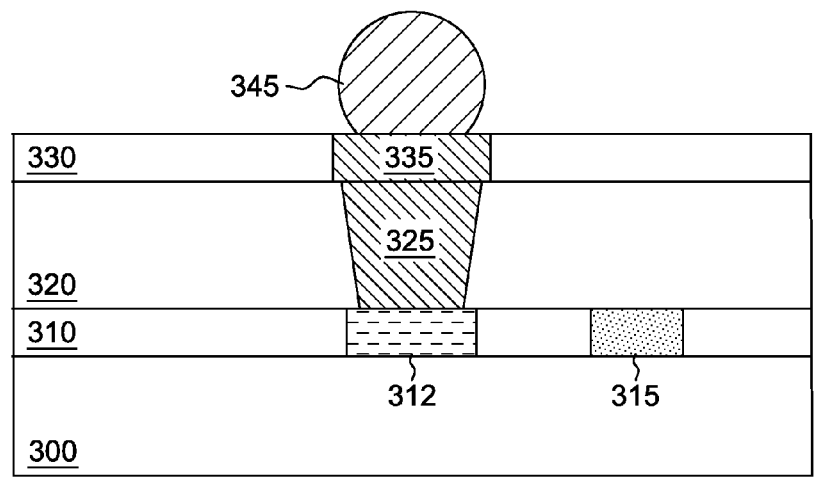
FIG. 3A illustrates a cross-sectional view of principal parts in the fabrication process of the semiconductor structure, in accordance with an embodiment of the present invention.
Figure 3B:
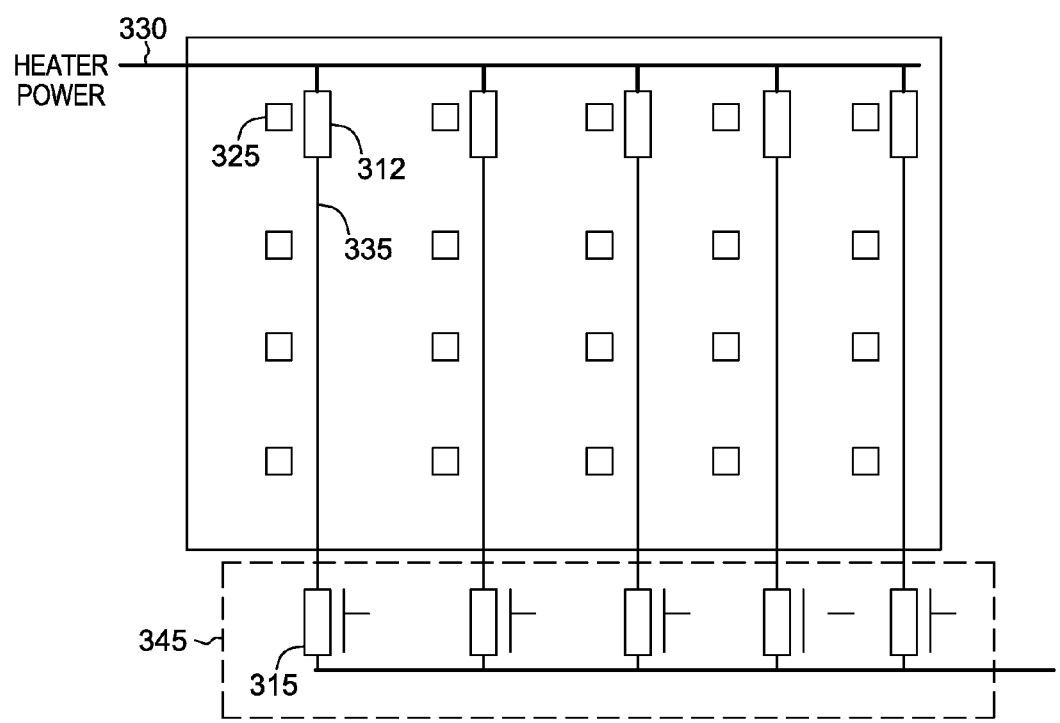
FIG. 3B depicts an expanded top-down view of the semiconductor structure of FIG. 3A with layer 320 removed for illustrative purposes, in accordance with an embodiment of the present invention.
Figure 4:
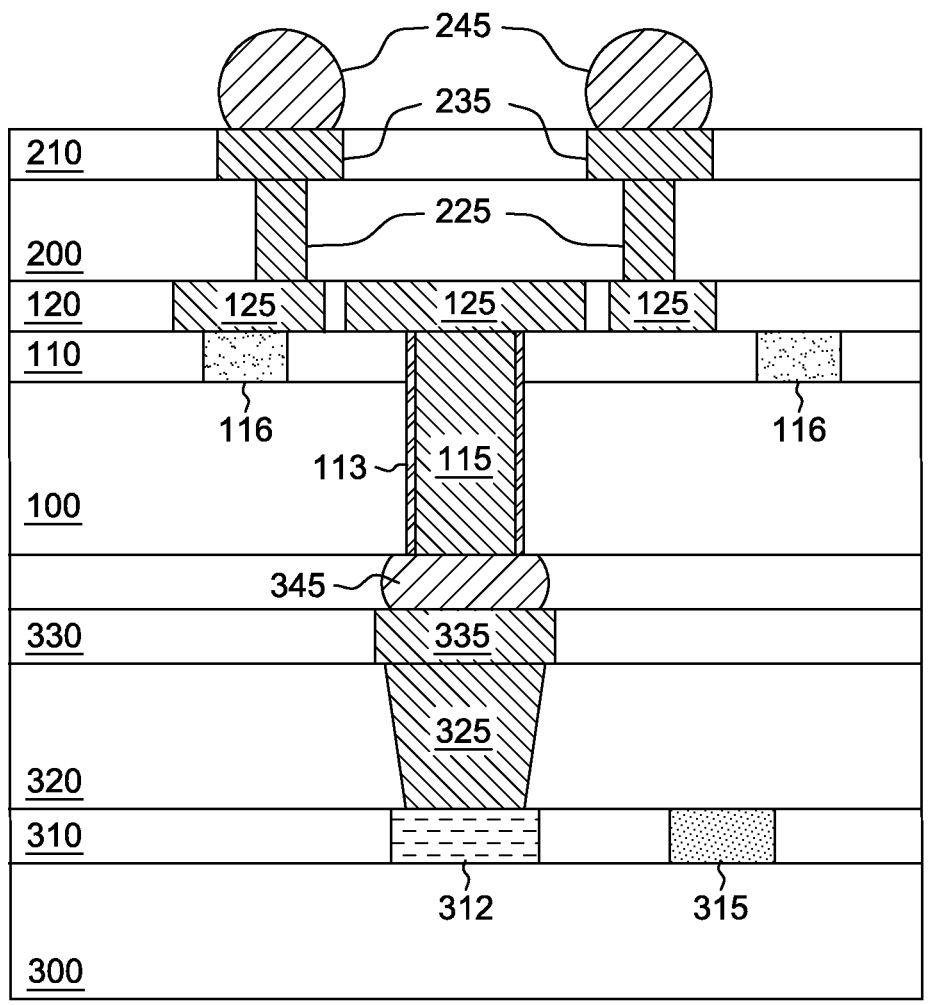
FIG. 4 illustrates a cross-sectional view of principal parts in the fabrication process of the semiconductor structure, in accordance with an embodiment of the present invention.

Sequential steps of an exemplary embodiment of a structure for establishing a thermal profile across a chip are described below with respect to the schematic illustrations of FIGS. 1-5. Specifically, FIGS. 1 and 2 depict the fabrication steps of a functional product chip, FIGS. 3A-3B depict the fabrication steps of a heat-generating semiconductor chip (heater chip), and FIG. 4 depicts the final semiconductor structure wherein the functional product chip is joined to the semiconductor heating chip, in accordance with an embodiment of the present invention. Similar reference numerals denote similar features.

FIG. 1 illustrates a cross-sectional view of principal parts in the fabrication process of a semiconductor structure, in accordance with an embodiment of the present invention. Devices 116 are formed on wafer 100 using conventional processes, such as conventional front-end-of-line processing. In an embodiment, devices 116 are electrical components utilized to determine the amount of heat present at that particular location. In another embodiment, devices 116 are electrical components that perform a predetermined function for the operation of the chip. Devices 116 can be one or more of a transistor, resistor, and capacitor. Wafer 100 includes semiconductor material, such as silicon.

Layer 110 is formed on wafer 100 using a conventional process, such as chemical vapor deposition (CVD). Layer 110 is an insulating layer that includes, for example, silicon dioxide. Insulating layers formed herein may be planarized prior to additional processing of the chip. A mask can be applied to layer 110 and a trench etched through layer 110 and partially through wafer 100 using conventional processes. Liner 113 is deposited in the trench followed by a conducting material, such as copper, to form TSV 115 using a conventional process, such as CVD. In an embodiment, liner 113 includes insulating material and/or barrier material that reduce the absorption of conducting material into wafer 100. Dielectric layer 120 may be formed on layer 110 using a conventional process.

Dielectric layer 120 can include dielectric material. Metal layer 125 is formed on dielectric layer 120 in a conventional manner. In certain embodiments, TSV 115 and liner 113 are not in electrical communication with a metal layer, such as metal layer 125. Dielectric layer 200 is formed on dielectric layer 120 utilizing a conventional process. FIG. 2 illustrates a cross-sectional view of principal parts in the fabrication process of the semiconductor structure, in accordance with an embodiment of the present invention. Dielectric layer 200 includes dielectric material. Dielectric layer 200 may include similar dielectric material as dielectric layer 120. Wiring layer 225, which includes conductive material, can be formed in dielectric layer 200 using conventional processes.

Dielectric layer 210, which includes dielectric material, may be formed on dielectric layer 200 using conventional processes. Wiring layer 235 may be formed in dielectric layer 210 in a similar manner that wiring layer 225 is formed in dielectric layer 200. In certain embodiments, additional metal layers and/or dielectric layers may be present in the semiconductor structure of FIG. 2. In other embodiments, additional electrical components than depicted may also be formed in the depicted semiconductor structure of FIG. 2.

Formation of the heater chip will now be discussed with reference to FIGS. 3A-3B. FIG. 3A illustrates a cross-sectional view of principal parts in the fabrication process of a semiconductor structure, in accordance with an embodiment of the present invention. Devices 312 and 315 may be formed on wafer 300 in a similar manner that devices 116 are formed on wafer 100 of FIG. 1. In certain embodiments, device 312 is formed in a manner to be in one or more of a thermal communication and electrical communication with a metal layer, such as metal layer 325. Dielectric layer 310 may be formed on wafer 300 in a manner similar to the formation of dielectric layer 110 on wafer 100. Dielectric layer 310 can include dielectric material. Layers 110 and 310 can include similar dielectric material. Device 312 is an electronic component, such as a resistor that generates heat that is transferred to the functional product chip. In an embodiment, device 312 generates a predetermined thermal output to establish a predetermined thermal profile on the functional product chip of FIG. 2. Device 312 can be a heat generator, such as a resistor, formed in a manner to be at least in thermal communication with metal layer 325 (discussed below). Device 312 can provide heat to conductor 325.

In an embodiment, device 315 is an electronic component, such as a transistor, that performs logical functions on the heater chip to generate a desire thermal profile. In another embodiment, device 315 is a sensor that regulates and/or monitors the amount heat generated by device 312 in the proximate area. In other embodiments, device 315 is a sensor that regulates and/or monitors the amount of heat present in a region of the functional product chip of FIG. 2.

Metal layer 325, which includes conductive material, may be formed in dielectric layer 320 in a similar manner that metal layer 125 is formed in dielectric layer 120. In an embodiment, metal layer 325 is a through-silicon via. In other embodiments, metal layer 325 is a through-silicon via that functions as a thermal probe. In still other embodiments, metal layer 325 selectably conducts heat from device 312 to the function product chip.

Dielectric layer 320, which includes dielectric material, may be formed on dielectric layer 310 in a similar manner that dielectric layer 310 is formed on wafer 300. Dielectric layers 320 and 310 can include similar dielectric material. Dielectric layer 330, which includes dielectric material, can be formed on dielectric layer 320 in a similar manner that dielectric layer 320 is formed on dielectric layer 310. Metal layer 335 is formed in dielectric layer 330 in a similar fashion that metal layer 125 is formed in dielectric layer 120. Bump 345, which includes fusible conductive material, such as solder, may be formed on metal layer 335 in a similar fashion that bumps 245 are formed on metal layer 210.

FIG. 3B depicts an expanded top-down view of the semiconductor structure of FIG. 3A with layer 320 removed for illustrative purposes, in accordance with an embodiment of the present invention. In certain embodiments, metal layer 325 is formed in an array of TSVs and devices 312 are formed in a manner to be in thermal communication with a row of the TSVs.

Line 330 connects devices 312, to a power source (not shown). Lines 335 connect devices 312 to devices 315, which are included in circuitry 345. Circuitry 345 generates control signals to determine the amount of heat generated at a particular position. Circuitry 345 may be formed on the heater chip or the functional product chip. Although the configuration of conductor 325 is depicted as a five-by-four array, other configurations may be utilized.

FIG. 4 illustrates a cross-sectional view of principal parts in the fabrication process of a semiconductor structure, in accordance with an embodiment of the present invention. Specifically, FIG. 4 depicts the final semiconductor structure wherein the functional product chip of FIG. 2 is joined to the heater chip of FIG. 3A. Wafer 100 is thinned from the backside using a conventional process, such as CMP, to expose metal layer 115 and liner 113. Layer 330 is joined to wafer 100 using a conventional chip join process in a manner such that bump 345 is aligned with metal layer 115, thereby allowing heat generated proximate to conductor 325 by device 312 to transfer to metal layer 115 and subsequently to the associated functional chip through metal layer 115. In an embodiment, device 116 determines the local temperature of the functional product chip and transfers the readings to device 315 on the heater chip wherein that information is utilized to control device 312 to generate a predetermined amount of heat.

Figure 5:
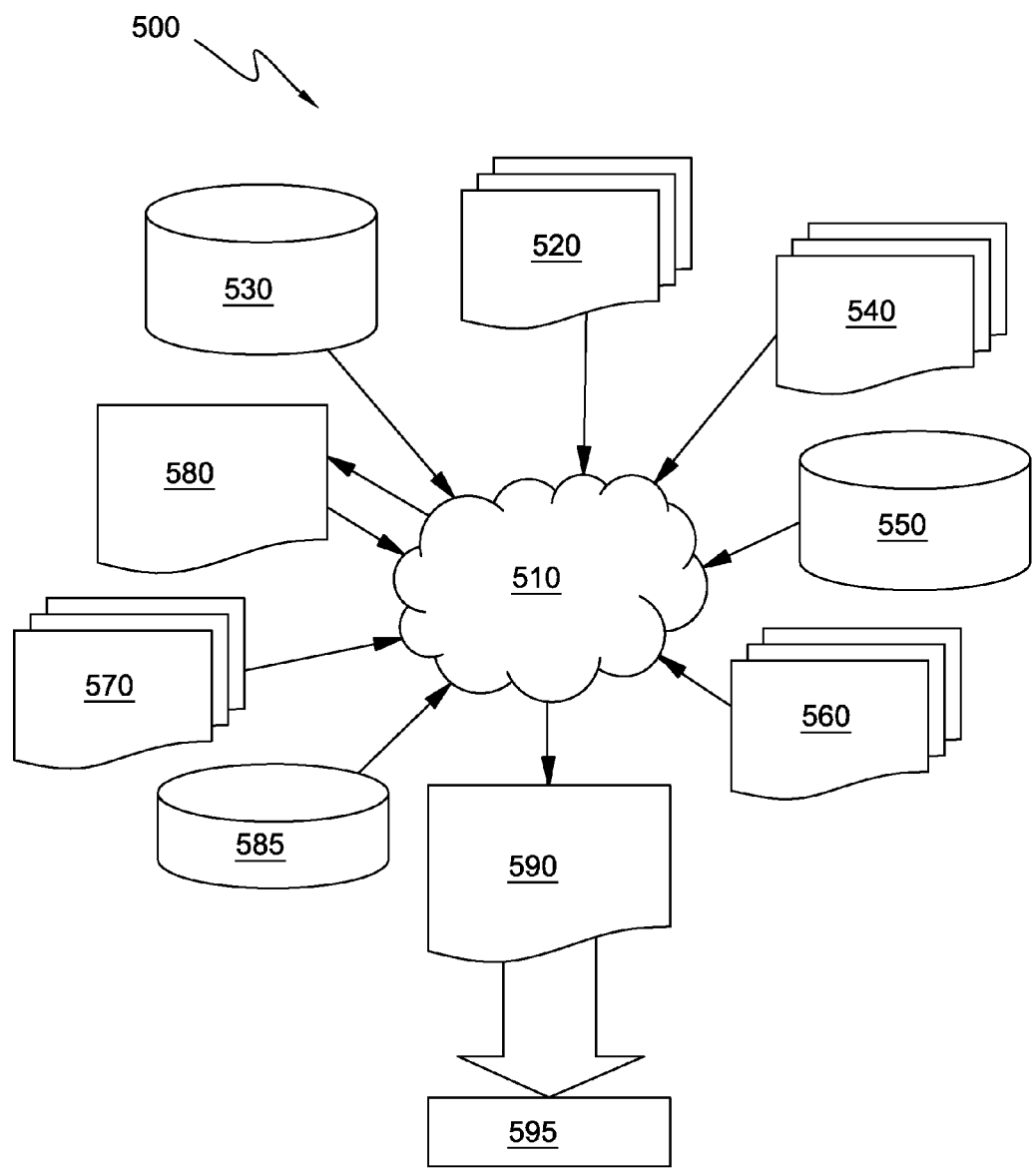
FIG. 5 is a flow diagram of a design process used in semiconductor design, manufacture, and/or test.

FIG. 5 shows a block diagram of an exemplary design flow 500 used, for example, in semiconductor IC logic design, simulation, test, layout, and manufacture. Design flow 500 includes processes, machines and/or mechanisms for processing design structures or devices to generate logically or otherwise functionally equivalent representations of the design structures and/or devices described above and shown in FIGS. 1-4. The design structures processed and/or generated by design flow 500 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array). Design flow 500 may vary depending on the type of representation being designed. For example, a design flow 500 for building an application specific IC (ASIC) may differ from a design flow 500 for designing a standard component or from a design flow 500 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 520 that is preferably processed by a design process 510. Design structure 520 may be a logical simulation design structure generated and processed by design process 510 to produce a logically equivalent functional representation of a hardware device. Design structure 520 may also or alternatively comprise data and/or program instructions that when processed by design process 510, generate a functional representation of the physical structure of a hardware device. Whether representing functional and/or structural design features, design structure 520 may be generated using electronic computer-aided design (ECAD) such as implemented by a core developer/designer. When encoded on a machine-readable data transmission, gate array, or storage medium, design structure 520 may be accessed and processed by one or more hardware and/or software modules within design process 510 to simulate or otherwise functionally represent an electronic component, circuit, electronic or logic module, apparatus, device, or system such as those shown in FIGS. 1-5. As such, design structure 520 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 510 preferably employs and incorporates hardware and/or software modules for synthesizing, translating, or otherwise processing a design/simulation functional equivalent of the components, circuits, devices, or logic structures shown in FIGS. 1-5 to generate a Netlist 580, which may contain design structures such as design structure 520. Netlist 580 may comprise, for example, compiled or otherwise processed data structures representing a list of wires, discrete components, logic gates, control circuits, I/O devices, models, etc. that describes the connections to other elements and circuits in an integrated circuit design. Netlist 580 may be synthesized using an iterative process in which Netlist 580 is resynthesized one or more times depending on design specifications and parameters for the device. As with other design structure types described herein, Netlist 580 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 510 may include hardware and software modules for processing a variety of input data structure types, including Netlist 580. Such data structure types may reside, for example, within library elements 530, and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 540, characterization data 550, verification data 560, design rules 570, and test data files 585 which may include input test patterns, output test results, and other testing information. Design process 510 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 510 without deviating from the scope and spirit of the invention. Design process 510 may also include modules for performing standard circuit design processes such as timing analysis, verification, design rule checking, place and route operations, etc.

Design process 510 employs and incorporates logic and physical design tools such as HDL compilers and simulation model build tools to process design structure 520, together with some or all of the depicted supporting data structures, along with any additional mechanical design or data (if applicable), to generate a second design structure 590. Design structure 590 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 520, design structure 590 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-5. In one embodiment, design structure 590 may comprise a compiled, executable HDL simulation model that functionally simulates the devices shown in FIGS. 1-5.

Design structure 590 may also employ a data format used for the exchange of layout data of integrated circuits and/or symbolic data format (e.g. information stored in a GDSII (GDS2), GL1, OASIS, map files, or any other suitable format for storing such design data structures). Design structure 590 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-5. Design structure 590 may then proceed to a stage 595 where, for example, design structure 590: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
a first semiconductor chip comprising:
a first substrate;
a first device and a second device on said first substrate, said second device selectively controlling said first device such that said first device generates a predetermined amount of heat;
a dielectric layer on said first device and said second device; and,
a conductor extending vertically through said dielectric layer to said first device;
a second semiconductor chip on said first semiconductor chip, said second semiconductor chip comprising:
a second substrate having a first surface and a second surface opposite said first surface;
a metal layer above said second surface; and,
a via extending vertically through said second substrate from said metal layer to said first surface and being connected to said conductor,
said metal layer, said via, said conductor and said first device being aligned vertically, and
said metal layer and said first device being thermally coupled by said conductor and said via such that heat generated by said first device is conducted through said conductor and said via to said metal layer.

2. The semiconductor structure of claim 1, said second semiconductor chip further comprising a third device on said second surface of said second substrate, said third device determining a local temperature on said second semiconductor chip and being in communication with said second device, said second device selectively controlling said first device based on said local temperature.

3. The semiconductor structure of claim 1, said first semiconductor chip comprising a heater semiconductor chip and said second semiconductor chip comprising a functional semiconductor chip.

4. The semiconductor structure of claim 1, said conductor comprising a thermal probe.

5. The semiconductor structure of claim 1, said second device selectively controlling said first device so that said first device generates said predetermined amount of heat so as to establish a predetermined thermal profile in said second semiconductor chip.

6. The semiconductor structure of claim 1, said first device comprising resistor.

7. The semiconductor structure of claim 1, said second device comprising a transistor.

8. The semiconductor structure of claim 1, said second device monitoring an amount of heat present in a region of said second semiconductor chip and that selectively controls said first device based on said amount of heat present in said region.

9. A semiconductor structure comprising:
a first semiconductor chip comprising:
a first substrate;
first devices and second devices on said first substrate, each second device selectively controlling a corresponding first device such that said corresponding first device generates a predetermined amount of heat;
a dielectric layer on said first devices and said second devices; and,
conductors extending vertically through said dielectric layer to said first devices, respectively;
a second semiconductor chip on said first semiconductor chip, said second semiconductor chip comprising:
a second substrate having a first surface and a second surface opposite said first surface;
a metal layer above said second surface; and,
a via extending vertically through said second substrate from said metal layer to said first surface and being connected to a conductor,
said metal layer, said via, said conductor and said first device being aligned vertically, and
said metal layer and said first device being thermally coupled by said conductor and said via such that heat generated by said first device is conducted through said conductor and said via to said metal layer.

10. The semiconductor structure of claim 9, said second semiconductor chip further comprising a third device on said second substrate, said third device determining a local temperature on said second semiconductor chip and being in communication with said second device, and said second device selectively controlling said first device based on said local temperature.

11. The semiconductor structure of claim 9, said first semiconductor chip comprising a heater semiconductor chip and said second semiconductor chip comprising a functional semiconductor chip.

12. The semiconductor structure of claim 9, said conductors comprising thermal probes.

13. The semiconductor structure of claim 9, said second devices selectively controlling said first devices so that said first devices establish a predetermined thermal profile in said second semiconductor chip.

14. The semiconductor structure of claim 9, said first devices comprising resistors.

15. The semiconductor structure of claim 9, said second devices comprising transistors.

16. The semiconductor structure of claim 9, said second devices monitoring an amount of heat present in a region of said second semiconductor chip and that selectively control said first devices based on said amount of heat present in said region.

17. A semiconductor structure comprising:
a first semiconductor chip comprising:
a first substrate;
a resistor and a transistor on said first substrate, said transistor selectively controlling said resistor such that said resistor generates a predetermined amount of heat;
a dielectric layer on said resistor and said transistor; and,
a conductor extending vertically through said dielectric layer to said resistor;
a second semiconductor chip on said first semiconductor chip, said second semiconductor chip comprising:
a second substrate having a first surface and a second surface opposite said first surface;
a metal layer above said second surface; and, a through-silicon via extending vertically through said second substrate from said metal layer to said first surface and being connected to said conductor, said metal layer, said through-silicon via, said conductor and said resistor being aligned vertically, and said metal layer and said resistor being thermally coupled by said conductor and said via such that heat generated by said resistor is conducted through said conductor and said via to said metal layer.

18. The semiconductor structure of claim 17, said second semiconductor chip further comprising a device on said second surface of said second substrate, said device determining a local temperature on said second semiconductor chip and being in communication with said transistor, said transistor selectively controlling said resistor based on said local temperature.

19. The semiconductor structure of claim 17, said transistor selectively controlling said resistor so that said resistor generates said predetermined amount of heat so as to establish a predetermined thermal profile in said second semiconductor chip.

20. The semiconductor structure of claim 17, said transistor monitoring an amount of heat present in a region of said second semiconductor chip and selectively controlling said resistor based on said amount of heat present in said region.

* * * * *